United States Patent
Suga et al.

(10) Patent No.: US 7,268,430 B2
(45) Date of Patent: Sep. 11, 2007

(54) SEMICONDUCTOR DEVICE AND PROCESS FOR MANUFACTURING THE SAME

(75) Inventors: Tadatomo Suga, Tokyo (JP); Toshihiro Itoh, Chiba (JP)

(73) Assignee: Renesas Technology Corp., Tokyo (JP)

( * ) Notice: Subject to any disclaimer, the term of this patent is extended or adjusted under 35 U.S.C. 154(b) by 94 days.

(21) Appl. No.: 11/213,882

(22) Filed: Aug. 30, 2005

(65) Prior Publication Data

US 2006/0043552 A1 Mar. 2, 2006

(30) Foreign Application Priority Data

Aug. 30, 2004 (JP) ............................ P2004-250453

(51) Int. Cl.
*H01L 23/48* (2006.01)
*H01L 23/52* (2006.01)

(52) U.S. Cl. ............... 257/737; 257/738; 257/669; 257/E23.021; 257/E23.069; 257/E23.508; 439/66

(58) Field of Classification Search ............ 257/737, 257/738, E23.021, E23.069, E23.508; 228/180.22; 438/613–617
See application file for complete search history.

(56) References Cited

U.S. PATENT DOCUMENTS

| 4,893,172 | A | * | 1/1990 | Matsumoto et al. | ......... | 174/254 |
| 5,897,326 | A | * | 4/1999 | Eldridge et al. | ............... | 438/14 |
| 5,983,493 | A | * | 11/1999 | Eldridge et al. | ............... | 29/855 |
| 6,307,159 | B1 | | 10/2001 | Soejima et al. | | |
| 6,716,037 | B2 | | 4/2004 | Kung et al. | | |
| 7,127,811 | B2 | * | 10/2006 | Mathieu et al. | ............... | 29/846 |
| 2001/0021596 | A1 | * | 9/2001 | Tamura | ........................ | 439/66 |
| 2004/0000428 | A1 | * | 1/2004 | Lii et al. | ..................... | 174/260 |

FOREIGN PATENT DOCUMENTS

| JP | 08-139226 | 5/1996 |
| JP | 2791429 B | 4/1998 |
| JP | 10-173006 | 6/1998 |
| JP | 10-303345 | 11/1998 |
| JP | 11-145172 | 5/1999 |
| JP | 11-214447 | 6/1999 |
| JP | 11-233669 | 8/1999 |
| JP | 2968051 | 8/1999 |
| JP | 2000-174165 | 6/2000 |
| JP | 2000-320148 | 11/2000 |
| JP | 2001-050980 | 2/2001 |
| JP | 2001-156091 | 6/2001 |
| JP | 2001-351892 | 12/2001 |
| WO | WO 97/16866 | 5/1997 |

OTHER PUBLICATIONS

Taiwanese Office Action issued in corresponding Taiwan Patent Application, dated Dec. 27, 2006.

* cited by examiner

*Primary Examiner*—Jasmine Clark
(74) *Attorney, Agent, or Firm*—McDermott Will & Emery LLP

(57) ABSTRACT

The present invention relates to a semiconductor device in which electrodes formed on a semiconductor chip and electrodes formed on a wiring board are electrically connected via projecting elastic electrodes, and further relates to a mounting method of reducing a pressure applied to electrodes formed on a substrate or underlying wirings when a semiconductor chip and a wiring board are bonded.

5 Claims, 4 Drawing Sheets

(a)

(b)

mounting (a)

(b)

(c)

(d)

(a)

(b)

SEMICONDUCTOR DEVICE AND PROCESS FOR MANUFACTURING THE SAME

FIELD OF THE INVENTION

The present invention relates to a semiconductor device in which electrodes formed on a semiconductor chip and electrodes formed on a wiring board are electrically connected via projecting elastic electrodes, and further relates to a mounting method of reducing a pressure applied to electrodes formed on a substrate or underlying wirings when a semiconductor chip and a wiring board are bonded.

BACKGROUND OF THE INVENTION

Previously, in manufacturing a semiconductor device by mounting a semiconductor chip on a wiring board, a wire bonding technique has been employed in which bonding pads on a semiconductor chip and leads on a wiring board are electrically connected by bonding via thin metal wires. Recently, in order to cope with a requirement for downsizing and lightening electrical equipments and an increase in the number of connection terminals of a semiconductor device, a flip chip mounting technology is employed in which a projecting electrode (hereinafter referred to as a "bump"), is formed on an electrode on a surface of a semiconductor chip and, then, the semiconductor chip is directly bonded to a wiring board in a face down manner.

In this flip chip mounting technology, bumps are formed on a plurality of electrodes formed on a semiconductor chip by using a metallic material such as solder and Au, these bumps and corresponding electrodes formed on a wiring board are positioned, and they are bonded by heat-press. In order to avoid destruction of bumps with a thermal stress caused by a difference in thermal expansion coefficients between the semiconductor chip and the wiring board during cooling after heat-press, an underfill material, which functions as a thermal stress buffer material, is supplied between the semiconductor chip and the wiring board.

Alternatively, a thermal stress caused by a difference in thermal expansion coefficients between a semiconductor chip and a wiring board during cooling after heat-press is buffered by using elastic bumps in place of underfill materials. For example, JP-A No. 1999-21447 and JP-A No. 2001-156091 disclose a structure in which a thermal stress is buffered by forming a cavity within a solder bump. JP-A No. 1999-233669 discloses a structure in which a thermal stress is buffered by utilizing elasticity of a resin by forming a bump consisting of a resin core made of a photo-sensitive resin such as polyimide, acrylic and the like and Ni plating and the like on a surface of the core. JP-A No. 2000-320148 discloses a structure in which a thermal stress generated between an integrated circuit and a mounting board is buffered by utilizing a U-shape elastic element at solder joints.

More recently, narrowing in wiring pitches as well as thinning and multilayering in semiconductor devices are accelerated, with depending on downsizing and performance enhancement in portable electronic equipments. In downsized, thinned or multilayered semiconductor devices, when a semiconductor chip is mounted on a wiring board by using the above conventional techniques to apply a pressure on the semiconductor chip or the wiring board, it is highly possible to break circuits formed thereon, affecting productivity and reliability of semiconductor devices. Especially when multilayer wiring boards are heat-pressed, low-k dielectric materials in multilayer wirings beneath electrode pads on a substrate or circuits of transistors and the like are frequently damaged, resulting in disorders in functions of semiconductor device.

Accordingly, for example, JP-A No. 2000-174165 discloses a structure in which a stress generated when a semiconductor chip is press bonded to a wiring board is buffered by forming a stress relaxation layer consisting of an epoxy resin under electrodes formed on the wiring board.

Alternatively, it is possible to reduce a pressure applied to a multilayer wiring beneath electrode pads on a substrate during bonding by using the above-mentioned bumps with a thermal stress buffering function and reducing its spring constant. However, in the previous bonding process, since a high pressure is applied during bonding, when a spring constant is low, it is possible that a pressure surpasses the elastic limit of the bump and, therefore, the bump cannot maintain its elasticity. Moreover, in the conventional bonding process, especially when a resin core-type bump is used, since bonding is carried out at a high temperature, a resin constituting a core deteriorates, causing a change in a spring constant.

SUMMARY OF THE INVENTION

Accordingly, an object of the present invention is to provide a high reliable semiconductor device in which electrodes formed on two substrates are electrically connected by bonding via elastic bumps to reduce a pressure applied to circuits and the like formed on the substrates. Another object of the present invention is to provide a process for manufacturing such a semiconductor device.

The present invention provides a semiconductor device comprising a semiconductor chip and a wiring board, wherein electrodes formed on the semiconductor chip and corresponding electrodes formed on the wiring board are electrically connected via bumps having a low spring constant. Since the spring constant is low, in a step for mounting a semiconductor chip on which multilayer wirings are formed on a wiring board, a pressure applied to the semiconductor chip and the wiring board is reduced and a stress due to repulsion from bumps decreases after mounting. By this, a high reliable semiconductor device can be provided.

Furthermore, the present invention provides also a process for manufacturing a semiconductor device without requiring a high temperature or a high pressure in order to mount multilayer wiring boards via bumps with a low spring constant.

Therefore, the present invention provides a semiconductor device comprising a first substrate on which one or more electrodes are formed, a second substrate on which one or more electrodes are formed, elastic bumps formed on the one or more electrodes on the second substrate, a spring constant of the elastic bump being 1000 N/m or lower, wherein surfaces of the one or more electrodes on the first substrate and surfaces of the elastic bumps formed on the one or more electrodes on the second substrate are electrically connected by bonding.

In the present invention, a combination of a first substrate and a second substrate includes a Si substrate—a Si substrate (e.g., semiconductor chips, a semiconductor and an interposer), a Si substrate—a printed wiring board (including a flexible board), a Si substrate—a compound semiconductor substrate (a substrate of GaAs, InP, etc.), a compound semiconductor substrate—a printed wiring board and the like. In the above combination, any substrate may be considered as a first substrate.

The semiconductor device of the present invention is characterized in that a spring constant of the elastic bump is 1000 N/m or lower.

According to the present invention, since the spring constant of the bump is low, when bumps are compressed by mounting a semiconductor chip on a wiring board, a stress applied to electrodes formed on the semiconductor substrate and the wiring board due to repulsion from bumps is reduced to enhance reliability of the semiconductor device.

In the present invention, any form of bumps may be used as far as the bumps are elastic. For example, the following can be used: a spring bump such as a spring structure having a crank shape, a U shape, a coil shape and the like; a resin core-type bump comprising an elastic resin core and an electrically-conductive material; a hollow bump with a structure in which a cavity is formed within an electrically-conductive bump.

In the semiconductor device of the present invention, surfaces of electrodes on the first substrate have a root mean square roughness of 10 nm or less, and surfaces of elastic bumps formed on the one or more electrodes on the second substrate have a root mean square roughness of 10 nm or less.

In the semiconductor device of the present invention, at least one of the first substrate and the second substrate has a thickness of 50 µm or less. It is desired that both the first substrate and the second substrate have a thickness of 50 µm or less.

By this, the present invention can be applied to a downsized and thinned semiconductor device. Furthermore, since a substrate obtains elasticity by thinning, even when heights of electrodes or bumps formed on the substrates disperse, the substrate itself absorbs dispersion in height.

In addition, the present invention provides a kit for manufacturing a semiconductor device in which a first substrate on which one or more electrodes are formed and a second substrate on which one or more electrodes are formed are electrically connected via elastic bumps, which comprises a first substrate on which one or more electrodes are formed, a second substrate on which one or more electrodes are formed, and elastic bumps formed on the one or more electrodes formed on the second substrate, wherein surfaces of the one or more electrodes on the first substrate have a root mean square roughness of 10 nm or lower, and surfaces of the elastic bumps formed on the one or more electrodes on the second substrate have a root mean square roughness of 10 nm or lower.

The semiconductor device of the present invention may be manufactured by bonding surfaces of the one or more electrodes on the first substrate included in the kit and surfaces of elastic bumps on the one or more electrodes on the second substrate included in the kit. Since a surface of the electrode on the first substrate and surfaces of the bumps on the second substrate, which are bonding surfaces, have a root mean square roughness of 10 nm or lower, these bonding surfaces may be bonded without applying a high temperature or a high pressure after activation by a technology such as a surface activation process.

In addition, the present invention provides also a process for manufacturing a semiconductor device in which a first substrate on which one or more electrodes are formed and a second substrate on which one or more electrodes are formed are electrically connected via elastic bumps, which comprises:

preparing a first substrate on which one or more electrodes are formed, and a second substrate on which one or more electrodes are formed and elastic bumps are further formed on the one or more electrodes;

flattening a surface of the electrode formed on the first substrate so that the root mean square roughness becomes 10 nm or lower when the root mean square roughness of the surface of the electrode is higher than 10 nm, and flattening a surface of the elastic bump formed on the electrode on the second substrate so that the root mean square roughness becomes 10 nm or lower when the root mean square roughness of the surface of the elastic bump is higher than 10 nm;

activating the surface of the electrode formed on the first substrate and the surface of the elastic bump formed on the one or more electrodes on the second substrate; and bonding the activated surface of the electrode and the activated surface of the elastic bump.

In the process for manufacturing a semiconductor device according to the present invention, a surface of the electrode formed on the first substrate and a surface of the elastic bump flattened on the electrode formed on the second substrate are polished by chemical mechanical polishing so that the root mean square roughness of these surfaces are 10 nm or lower. The flat or flattened surfaces of the electrodes formed on the first substrate or the bumps formed on the second substrate are activated by a surface activation process. Then, the activated surfaces of the electrodes and the activated surface of the bump are bonded.

The above-described bonding technology is called as a surface activated bonding (SAB) process. This technology is a process in which bonding is carried out at a lower energy relative to the conventional bonding processes, that is, at a temperature of a room temperature or lower and under a low pressure, by polishing and activation to clean bonding surfaces of materials to be bonded, and is characterized in that: physical means such as ion bombardment are actively utilized for activating bonding surfaces; bonding is based on atomic level characterization of bonding surfaces; and bonding is effective not only between metals but also between materials having different bonding manners such as between metals and ceramics.

Furthermore, this bonding technology can be applied to not only bonding between inorganic materials such as metals, semiconductors, ceramics and the like but also bonding between an organic material and an inorganic material.

In the surface activated bonding, it is required that surfaces of materials to be bonded are flat in order to contact atoms on both surfaces effectively. The flatness required depends on surface energies and elastic constants of materials to be bonded, there is rather an analytical result indicating that surfaces can be bonded only by contacting when the surfaces have a root mean square roughness in a range from 1 to 10 nm. Indeed, silicon wafer surfaces have a root mean square roughness of about 1 nm, and those surfaces can be bonded as they are.

When a surface of a material to be bonded is not flat, the surface should be polished by a chemical mechanical polishing (CMP) process in which material to be polished is pressed onto a flat polishing plate to polish it, while a mixed liquid of abrasives such as ceramic particles or diamond particles and a chemical substance having an etching effect is sprayed on the plate. Since the CMP process comprises both mechanical polishing with abrasives and chemical polishing, a root mean square roughness can be decreased to 10 nm or lower.

Polished surfaces cannot be bonded only by contacting them because a stabilized layer is formed on those surfaces by oxidization or adsorption of organics and the like. The SAB is enabled by removing a stabilized layer by irradiating an energy wave such as plasma, accelerated ion beam, fast atom beam (FAB), radical beam and laser in vacuo. Thus, activated surfaces can be bonded only by a contact without heating at a high temperature.

As a bonding process by SAB, for example, Japanese Patent No. 2791429 discloses a process for bonding silicon wafers in which bonding surfaces are sputter etched by exposing with an inert gas ion beam or an inert gas fast atom beam at room temperature in vacuo prior to bonding two wafers. In the SAB process, oxides and inorganics on bonding surfaces of silicon wafers are blown out by irradiating the above-mentioned beams to form surfaces with activated silicon atoms, and these activated surfaces are bonded through strong bonding forces between atoms. Therefore, in this process, essentially, heating for bonding becomes unnecessary and merely contacting activated surfaces allows them to be bonded at room temperature.

JP-A No. 2001-351892 discloses a mounting apparatus for the SAB process which enables mass-production by shortening a tact time of a mounting step. As shown in FIG. 4, this mounting apparatus comprises a cleaning chamber for cleaning and activating bonding surfaces of materials to be bonded by beam irradiation, and a mounting chamber for bonding cleaned surfaces, and a conveying part for conveying materials to be bonded provided between the cleaning chamber and the mounting chamber.

In the process for manufacturing a semiconductor device according to the present invention, after activation, surfaces of one or more electrodes formed on the first substrate and surfaces of elastic bumps formed on the one or more electrodes formed on the second substrate are bonded at 150° C. or lower.

That is, according to the present invention, since a surface of a bump and a surface of an electrode on a substrate can be bonded without applying a high temperature or a high pressure, even when a spring constant of the bump is low, especially when a resin core-type bump is used, elastic properties of the bump is not thermally changed and an applied pressure for bonding does not surpass the elastic limit of the bump. Thus, a substrate can be mounted without deteriorating elasticity of bumps.

According to the present invention, a multilayer wiring board is mounted via bumps having a low elasticity, damage to circuits and the like formed on a substrate is reduced and, thereby, a high reliable semiconductor device may be provided. Moreover, since the SAB process is used, it becomes possible to mount a multilayer wiring board via bumps having low elasticity.

BEST MODE OF THE INVENTION

The semiconductor device according to the present invention is manufactured by mounting a first substrate on a second substrate, and is characterized in that electrodes formed on the first substrate and electrodes formed on the second substrate are electrically connected via bumps.

Embodiments of the present invention are described below.

Figure 1:
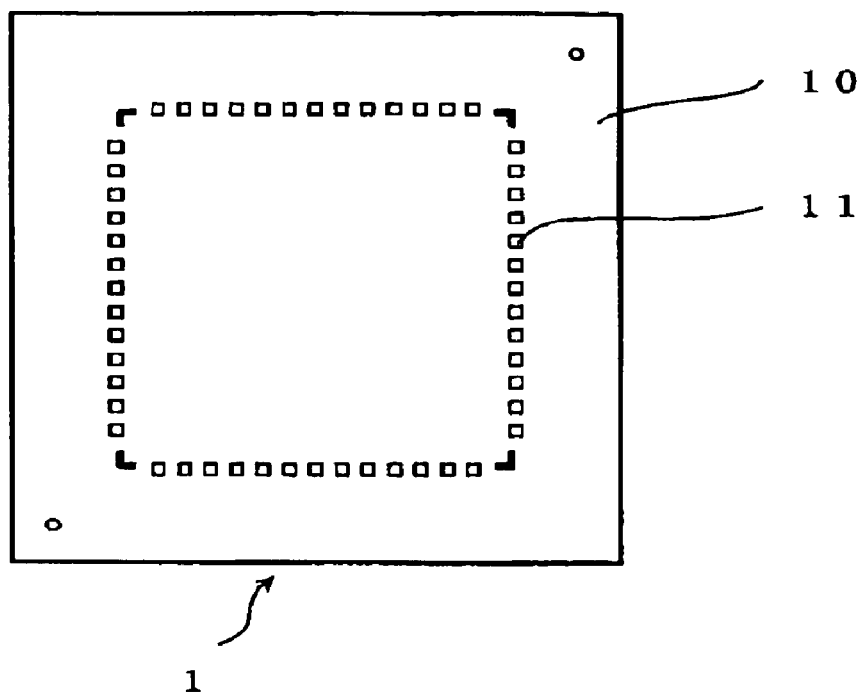
FIG. 1 shows plan views of a semiconductor chip (a) and an interposer (b) used in a semiconductor device of the present invention.
Figure 1:
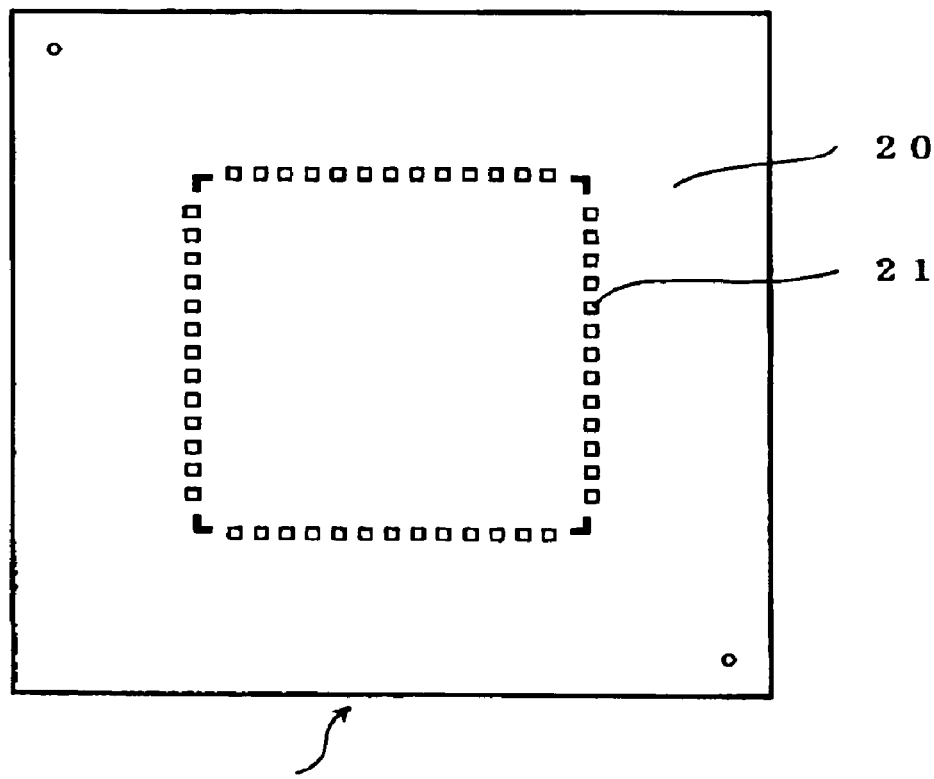

As shown in FIG. 1(a), on a Si substrate 10 of a semiconductor chip 1, one or more electrodes 11 and other circuits (not shown) are formed by using conventional materials and a conventional process.

As shown in FIG. 1(b), on a Si substrate 20 of an interposer 2, one or more electrodes 21 and other circuits (not shown) are formed by using conventional materials and a conventional process.

Figure 2:
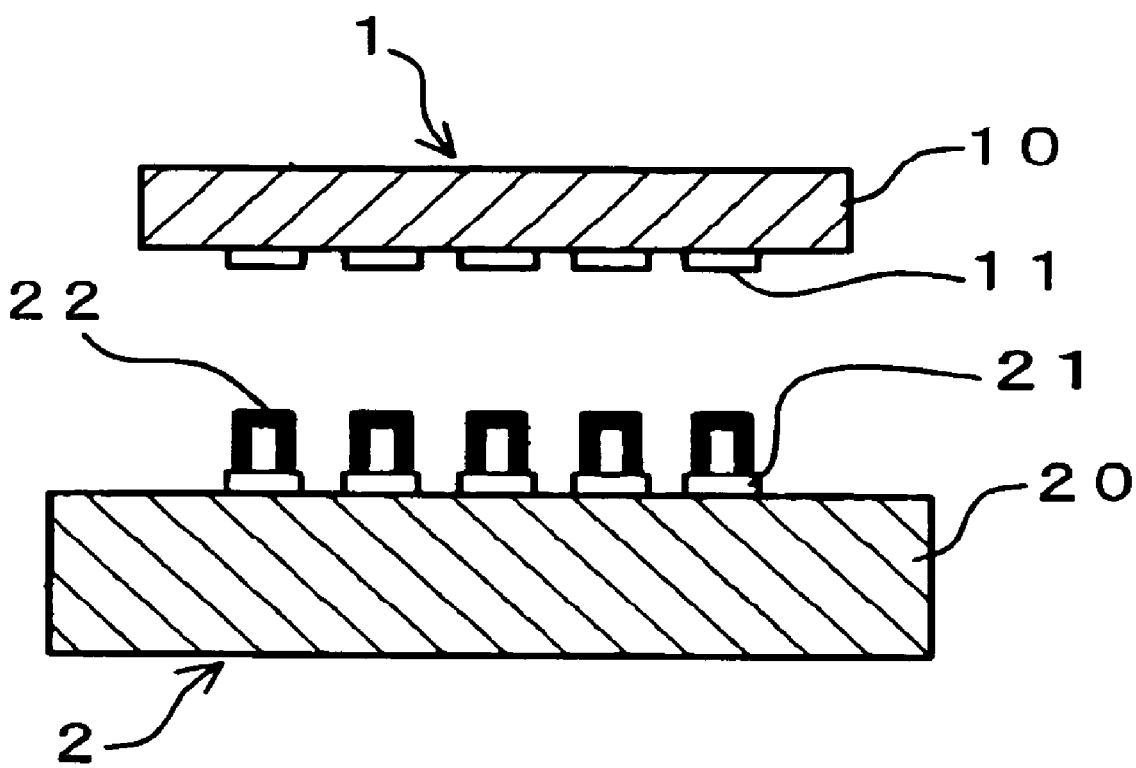
FIG. 2 shows a schematic illustration explaining a mounting step for a semiconductor device of the present invention.
Figure 2:
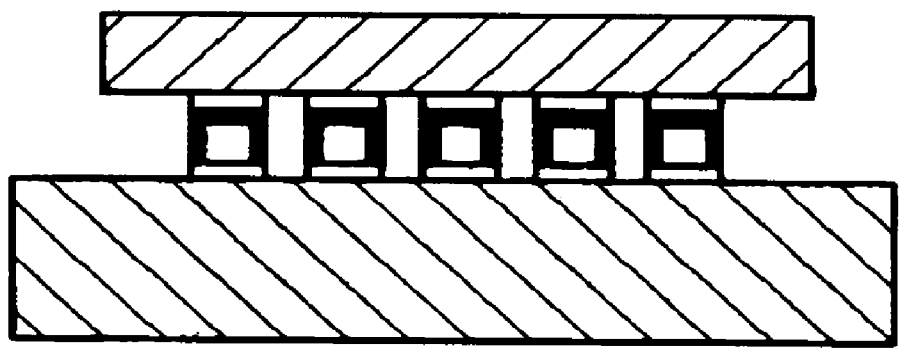

As shown in FIG. 2, elastic bumps 22 are bonded on each of the one or more electrodes 21. Since layout of the electrodes 11 formed on the Si substrate 10 corresponds to layout of the electrodes 21 formed on the Si substrate 20, the semiconductor chip 1 is mounted on the interposer 2 by bonding surfaces of bumps 21 and one or more electrodes 11 formed on the Si substrate 10.

As used herein, a term "corresponding" or "correspond to" means that electrodes formed on a first substrate and electrodes formed on a second substrate have a positional relationship where they can be electrically connected when the first substrate is mounted on the second substrate.

Figure 3:
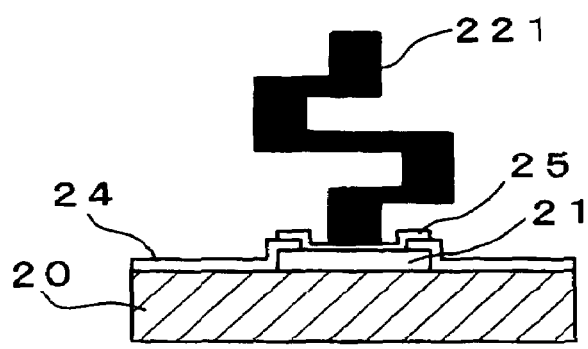
FIG. 3 shows cross-sectional views of elastic bumps used in the present invention.
Figure 3:
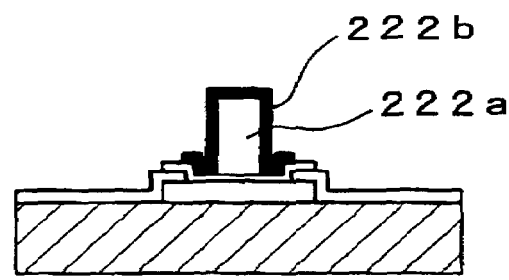
Figure 3:
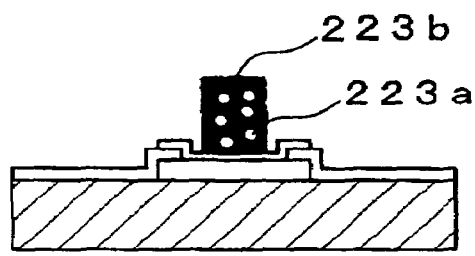
Figure 3:
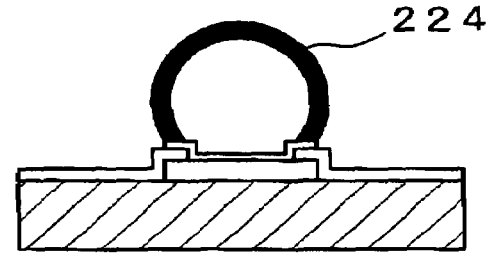

FIG. 3 shows cross-sectional views of exemplary combinations of an electrode and a bump formed on the interposer 2. The interposer 2 is made by forming electrodes 21 and other circuits on the Si substrate 20 and forming a protective layer 24 on a region other than a region where electrical connection will be formed.

Bumps 22 may be formed directly on the electrodes 21, but it is preferred that an intermediate layer 25 is formed on the electrodes 21, and then the bumps 22 are formed thereon for the purposes of preventing components from diffusing between electrodes 21 and bumps 22 and improving an adhesion strength therebetween.

Elastic bumps may be formed by depositing on electrodes formed on a substrate by using a conventional process such as lithography, or by fabricating bumps separately and bonding these bumps on electrodes formed on a substrate by using a conventional process or the above-mentioned surface activated bonding.

In the present invention, bumps in any shape may be used as far as they have elasticity. For example, a spring bump 221 shown in FIG. 3(a), resin core-type bumps 222 and 223 shown in respective FIGS. 3(b) and 3(c), a hollow bump 224 shown in FIG. 3(d) and the like may be used.

FIG. 3(a) shows a spring bump 221 having a crank-shape spring structure as one embodiment, but a U-shape or coil-like spring structure may also be used. FIG. 3(b) shows one embodiment of resin core-type bumps. A resin core-type bump 222 is made by disposing a resin core 222a on the electrode 21 and forming an electrically-conductive layer 222b thereon to allow electrical connection. FIG. 3(c) shows another embodiment of resin core-type bumps. This resin core-type bump 223 has a structure in which a plurality of resin beads 223a are dispersed in an electrically-conductive material 223b. FIG. 3(d) shows one embodiment of hollow bumps. This hollow bump 224 has a structure in which a cavity is formed inside an electrically-conductive bump.

Specifically, the resin core-type bump 222 is made by forming a resin core 222a on the intermediate layer 25 using a polyimide photo-sensitive resin, and forming an electrically-conductive coating 222b around the resin core 222a by Ni plating.

In the case where a plurality of bumps are bonded on a substrate by a conventional process, since a maximum difference in bump height within one substrate is about 1 μm due to dispersion, when a semiconductor chip is mounted on a wiring board on which a plurality of bumps are bonded, the highest bump should be compressed by at least 1 μm in order to contact all of the plurality of bumps with electrodes. If a conventional bump is used here, a pressure applied to an electrode pad formed on a semiconductor chip and a wiring board due to repulsion from a compressed bump is calculated to be about 50 gf. When a semiconductor chip or a wiring board is thinned depending on a progress in downsizing and thinning of a semiconductor device, applying of the above stress to the electrode pads leads to a breakdown of the semiconductor device. Therefore, a pressure applied to an electrode pad should be reduced.

Therefore, in the present invention, a maximum difference in height for a plurality of bumps and a frame member is set within 1 μm. That is, the largest compressed length of the highest bump is 1 μm by mounting a semiconductor chip 1 to an interposer 2. If a maximum permissive pressure per electrode pad is set to for example 1 gf, a permissive spring constant k of the bump is calculated to be 1000 N/m or lower.

Accordingly, in the present invention, a spring constant is preferably 1000 N/m or lower.

Since the spring constant is low, a pressure applied to an electrode pad formed on the semiconductor chip and the wiring board due to repulsion from bumps can be reduced when the semiconductor is mounted on the wiring board to compress bumps and, thereby, a wiring layer beneath the electrodes is not damaged so that the reliability of the semiconductor device can be improved.

The Si substrate 20 is positioned so that surfaces of these bumps 22 can contact with each of the corresponding electrodes 11 formed on the Si substrate 10 and, after that, the semiconductor chip 1 is mounted to the interposer 2 by bonding to make a semiconductor device shown in FIG. 2.

In the present invention, before mounting the semiconductor chip 1 on the interposer 2, a root mean square roughness (RMS) values $R_q$ for surfaces of electrodes formed on the semiconductor chip 1 and surfaces of bumps formed on the electrodes of the interposer 2 were measured with a surface roughness meter and an atomic force microscope. The RMS values $R_q$ for the surfaces of bumps were found to be around 200 to 300 nm and the RMS values $R_q$ for the surfaces of electrodes formed on the substrate were found to be several tens nm.

As described above, when the RMS values for bonding surfaces are in a range of 1 to 10 nm, these surfaces can be bonded without applying a high temperature or a high pressure. On the other hand, when the RMS values for the bonding surfaces are above 10 nm, it is confirmed that a high temperature and a high pressure are required for bonding as in the conventional process even when these surfaces are activated. Thus, when RMS values for bonding surfaces exceed 10 nm, the bonding surfaces should be flattened prior to activation.

Flattening may be carried out by using any conventional process, but it is effective to use a chemical mechanical polishing (CMP) process in order to make RMS values for the surfaces 10 nm or lower. For example, a surface is polished until its RMS value becomes 10 nm or lower while a mixed solution of an abrasion liquid containing abrasives such as diamond particles and an etchant such as hydrofluoric acid is sprayed to a flat polishing plate.

Figure 4:
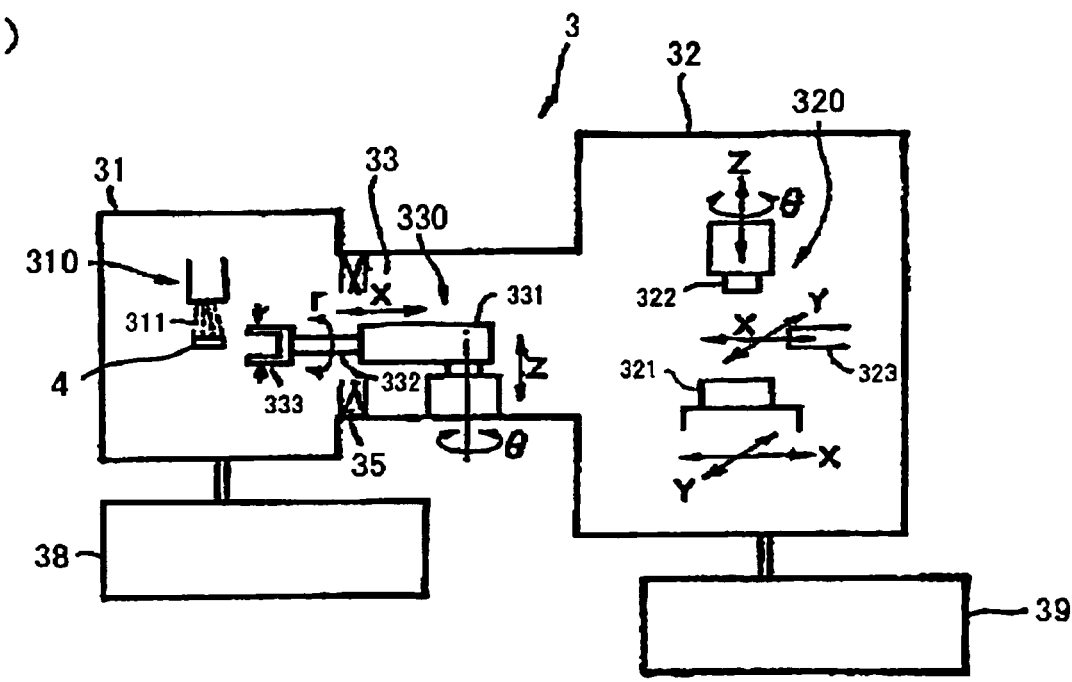
FIG. 4 shows schematic illustrations explaining a mounting apparatus for manufacturing a semiconductor device of the present invention.
Figure 4:
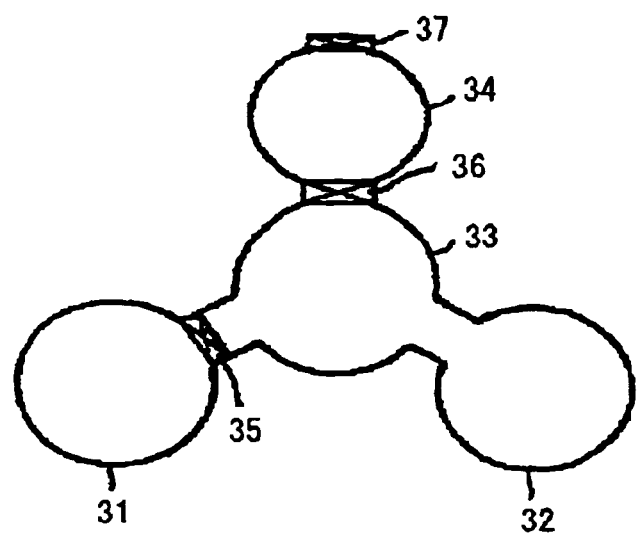

After confirming that the bonding surfaces are flat, a semiconductor device is manufactured by mounting the semiconductor chip on the wiring board by using a SAB process. A mounting apparatus for manufacturing a semiconductor device of the present invention is depicted in FIG. 4. In this figure, a first substrate and a second substrate are commonly described as a material to be bonded 4 for convenience.

When this mounting apparatus 3 is used, these surfaces may be cleaned by irradiating the surfaces of electrodes 11 on the Si substrate 10 and the surfaces of bumps 22 formed on the Si substrate 20 with an argon fast atom beam to remove oxides and organics in a cleaning chamber in which an argon fast atom beam can be irradiated in vacuo.

The mounting apparatus 3 is provided with a cleaning chamber 31 which accommodates a cleaning means 310 for cleaning bonding surfaces of materials to be bonded 4, a mounting chamber 32 which accommodates a mounting means 320 for surface-activated bonding two materials to be bonded 4 having been cleaned with the cleaning means 310, and a conveying part 33 which communicates the cleaning chamber 31 and the mounting chamber 32. Bonding surfaces are activated by cleaning to remove a stabilized layer formed by oxidation or adsorption of organics.

In addition, an introduction chamber 34 is connected to the conveying chamber 33 in order to introduce materials to be bonded 4 from the exterior into the interior of the mounting apparatus 3. In the conveying chamber 33, a conveying means 330 is disposed which conveys the materials to be bonded 4 introduced from the exterior to the introduction chamber 34 to the cleaning chamber 31, and conveys each of the materials to be bonded 4 cleaned with the cleaning means 310 to the mounting means 320. Further, a shutter means 35 is provided between the cleaning chamber 31 and the conveying chamber 33. The introduction chamber 34 is provided with shutter means 36 and 37 for carrying in and out the materials to be bonded 4.

The cleaning means 310 cleans and activates the bonding surface of the material to be bonded 4 by irradiating an energy wave 311 toward the surface. As the energy wave 311, either of plasma, ion beam, atom beam, radical beam, and laser is used.

To the cleaning chamber 31 is attached a reduced pressure gas atmosphere forming means 38 such as a vacuum pump, which can bring the interior of the cleaning chamber 31 into a predetermined reduced pressure gas atmosphere. As a gas in the cleaning chamber 31 for forming a reduced pressure gas atmosphere, air and an inert gas may be used. When an inert gas is used, an inert gas replacing means may also be attached.

The conveying means 330 consists of a body 331 capable of moving in a vertical direction (a Z-direction) and a rotational direction (a θ-direction), a rod 332 capable of telescoping in an axial direction (a X-direction) and a tip arm 333 capable of rotating in a r-direction around the axis of the rod 332. This tip arm 333 has a mechanism for holding and releasing the materials to be bonded 4.

The shutter means 35 provided between the cleaning chamber 31 and the conveying chamber 33 controls connection and isolation therebetween. When the interior of the cleaning chamber 31 is brought into a predetermined reduced gas atmosphere, the shutter means 35 is closed to block the connection to the conveying chamber 33. The shutter 35 is opened to introduce materials to be bonded 4 into the cleaning chamber 31 or to remove cleaned materials to be bonded 4 from the cleaning chamber 31.

On the mounting means 320, two materials to be bonded 4, the bonding surfaces of which have been cleaned, are surface-activated bonded. The mounting means 320 is provided with a bonding stage 321 and a bonding head 322, which respectively hold the two materials to be bonded 4. In order to position the two materials to be bonded 4 for bonding, the bonding stage 321 is capable of adjusting a position in the X- and Y-directions (a horizontal directions) and the bonding head 322 is capable of adjusting a position in a Z-direction (a vertical direction) and a rotational direction (a θ-direction).

In addition, the bonding stage 321 and the bonding head 322 are respectively provided with a temperature control means consisting of a heater and a thermocouple (not shown), thereby, the materials to be bonded can be heated at an arbitrary temperature.

A two-field camera 323 having two fields along the vertical direction is provided adjustably in the X- and Y-directions between the bonding stage 321 and the bonding head 322 in order to detect an amount of a difference in positions between two materials to be bonded 4. Based on the detected results, the two materials to be bonded 4 are positioned at desired positions.

To the mounting chamber 32 is attached an inert gas replacing means 39 for bringing the interior of the mounting chamber 32 into an inert gas atmosphere so that bonding of materials to be bonded 4 are carried out under the inert gas atmosphere. A gas atmosphere in the mounting chamber 32 may be an inert gas atmosphere or a gas atmosphere which does not react with the materials to be bonded. For example, when a material to be bonded has electrodes and these electrodes are bonded to another material to be bonded, a gas atmosphere which does not react with these electrodes (e.g., a nitrogen gas) may be used. Bonding in this mounting chamber 32 can be carried out either in the air or under a reduced pressure.

Specifically, the interposer 2 was first introduced into the introduction chamber 34 through the shutter means 37. Then, the shutter means 36 was opened and the interposer 2 was held with the conveying means 330. The shutter means 36 was closed, if needed, and the shutter means 35 was opened and then the interposer 2 held with the conveying means 330 was conveyed to the cleaning chamber 31. After closing the shutter means 35, a cleaning step was carried out in the cleaning chamber 31 by irradiating an energy wave 311 to the surfaces of the bumps 22 formed on the Si substrate 20 to activate them. The interior of the cleaning chamber 31 was brought into a reduced pressure Ar atmosphere and, under this atmosphere, an Ar fast atom beam was irradiated as an energy wave The irradiation of the energy wave blew out oxides or organics from the surface of the bumps, forming a surface with activated atoms. After the predetermined cleaning step, the shutter 35 was opened, the interposer 2 in which the surfaces of the bumps 22 had been activated was held with the conveying means 330 and was conveyed to the mounting chamber 32 and, then, it was affixed on the bonding stage 321.

Next, a semiconductor chip 1 was introduced into the introduction chamber 34 through the shutter means 37. The surfaces of the electrodes 11 formed on the semiconductor chip 1 were cleaned and activated by irradiating an energy wave 311 as in the interposer 2. The irradiation of the energy wave blew out oxides or organics from the surfaces of the electrodes, forming a surface with activated atoms. After the predetermined cleaning step, the shutter 35 was opened, the semiconductor chip 1 in which the surfaces of the electrodes 11 had been activated was held with the conveying means 330 and was conveyed to the mounting chamber 32 and, then, it was affixed on the bonding head 322.

In the mounting step, bonding was carried out under a predetermined inert gas atmosphere formed by the inert gas replacing means 39. In this mounting step, the surfaces of the bumps 22 formed on the interposer 2 affixed on the bonding stage 321 and the surfaces of the electrodes 11 on the semiconductor chip 1 affixed on the bonding head 322 were bonded at 150° C. As discussed above, since the bonding surfaces have been activated, they can be bonded basically by a mere contact with exception for compressing bumps in order to absorb dispersion in the bump heights. The semiconductor device made by bonding may be directly conveyed from the mounting chamber 32 to a next step or may be conveyed by using the above conveying means 330.

Further, in the present invention, a sealing resin such as an underfill material may be filled between a semiconductor chip and a wiring board in order to effectively prevent bumps and electrodes formed on a substrate from deteriorating by attacks of oxygen or moisture. Thus, a semiconductor device with a higher reliability, electrical connection of which is not destroyed, may be obtained.

Although the semiconductor device of the present invention and the process for manufacturing the same have been explained by using exemplary embodiments, they only illustrate the present invention and do not intend to limit the present invention. For example, the semiconductor device is manufactured by forming elastic bumps on the electrodes on a wiring boar, and surface-activated bonding surfaces of the bumps and surfaces of electrodes formed on a semiconductor chip, but in the present invention, bumps may be formed on a semiconductor chip and these bumps and electrodes formed on a wiring board may be bonded.

Furthermore, the present invention may be applied to a semiconductor device comprising a combination other than a combination between a Si substrate of a semiconductor chip and a Si substrate of an interposer, for example, a combination between a Si substrate of a semiconductor chip as a first substrate and a printed wiring board as a second substrate.

What we claimed are:

1. A semiconductor device comprising a first substrate on which one or more electrodes are formed, a second substrate on which one or more electrodes are formed, elastic bumps formed on the one or more electrodes on the second substrate, a spring constant of the elastic bump being 1000 N/m or lower,
   wherein surfaces of the one or more electrodes on the first substrate and surfaces of the elastic bumps formed on the one or more electrodes on the second substrate are electrically connected by bonding.

2. The semiconductor device according to claim 1, wherein the elastic bump is a spring bump.

3. The semiconductor device according to claim 1, wherein the elastic bump is a resin core-type bump.

4. The semiconductor device according to claim 1, wherein the elastic bump is a hollow bump.

5. A kit for manufacturing a semiconductor device in which a first substrate on which one or more electrodes are formed and a second substrate on which one or more electrodes are formed are electrically connected via elastic bumps, which comprises a first substrate on which one or more electrodes are formed, a second substrate on which one or more electrodes are formed, and elastic bumps formed on the one or more electrodes on the second substrate,
   wherein surfaces of the one or more electrodes on the first substrate have a root mean square roughness of 10 nm or lower, and surfaces of the elastic bumps formed on the one or more electrodes on the second substrate have a root mean square roughness of 10 nm or lower.

* * * * *

UNITED STATES PATENT AND TRADEMARK OFFICE
CERTIFICATE OF CORRECTION

PATENT NO. : 7,268,430 B2  
APPLICATION NO. : 11/213882  
DATED : September 11, 2007  
INVENTOR(S) : Tadatomo Suga et al.

It is certified that error appears in the above-identified patent and that said Letters Patent is hereby corrected as shown below:

On the title page  
Item "(73) Assignee:", add:

Tadatomo Suga, Tokyo, (JP),  
Oki Electric Industry Co., Ltd., Tokyo, (JP),  
Sanyo Electrie Co., Ltd., Osaka, (JP),  
Sharp Kabushiki Kaisha, Osaka, (JP),  
Sony Corporation, Tokyo, (JP),  
Kabushiki Kaisha Toshiba, Tokyo, (JP),  
NEC Corporation, Tokyo, (JP),  
Fujitsu Limited, Kanagawa, (JP),  
Matsushita Electric Industrial Co., Ltd., Osaka, (JP),  
Rohm Co., Ltd., Kyoto, (JP)

Signed and Sealed this

Seventeenth Day of June, 2008

JON W. DUDAS  
*Director of the United States Patent and Trademark Office*